(12) United States Patent
Jang et al.

(10) Patent No.: US 11,265,022 B2
(45) Date of Patent: Mar. 1, 2022

(54) MEMORY SYSTEM AND OPERATING METHOD THEREOF

(71) Applicant: SK hynix Inc., Gyeonggi-do (KR)

(72) Inventors: Mun Seon Jang, San Jose, CA (US); Hoiju Chung, San Jose, CA (US); Tae Kyun Kim, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/109,297

(22) Filed: Dec. 2, 2020

(65) Prior Publication Data

US 2021/0083690 A1    Mar. 18, 2021

Related U.S. Application Data

(63) Continuation-in-part of application No. 16/415,781, filed on May 17, 2019, now Pat. No. 10,901,842.

(60) Provisional application No. 62/838,137, filed on Apr. 24, 2019, provisional application No. 62/673,333, filed on May 18, 2018.

(51) Int. Cl.
*H03M 13/00* (2006.01)
*H03M 13/15* (2006.01)
*H03M 13/11* (2006.01)
*G06F 3/06* (2006.01)

(52) U.S. Cl.
CPC ...... *H03M 13/1575* (2013.01); *G06F 3/0619* (2013.01); *G06F 3/0653* (2013.01); *G06F 3/0679* (2013.01); *H03M 13/1174* (2013.01); *H03M 13/1515* (2013.01)

(58) Field of Classification Search
CPC ......... H03M 13/1575; H03M 13/1174; H03M 13/1515; G06F 3/0679; G06F 3/0619; G06F 3/0653
See application file for complete search history.

(56) References Cited

U.S. PATENT DOCUMENTS

| | | | |
|---|---|---|---|
| 9,336,978 B2 * | 5/2016 | Wang | H01H 85/0241 |
| 2010/0241930 A1 | 9/2010 | Chang et al. | |
| 2010/0262889 A1 | 10/2010 | Bains | |
| 2015/0007001 A1 * | 1/2015 | Kern | H03M 13/616 714/785 |
| 2016/0011940 A1 | 1/2016 | Hu et al. | |
| 2019/0042358 A1 | 2/2019 | Criss et al. | |

* cited by examiner

*Primary Examiner* — Samir W Rizk
(74) *Attorney, Agent, or Firm* — IP&T Group LLP

(57) ABSTRACT

A memory system includes a memory controller including: a memory core configured to store data and an error correction code corresponding to the data; a syndrome generator configured to generate a first syndrome by substituting the data and the error correction code, read from the memory core, into a first check matrix, and generate a second syndrome by substituting the data and the error correction code, read from the memory core, into a second check matrix; and an error correction unit configured to correct an error of the read data and error correction code by using the first syndrome and the second syndrome, wherein constituents having values of '1' in the first check matrix have values of '1' also in the second check matrix.

18 Claims, 13 Drawing Sheets

MEMORY SYSTEM AND OPERATING METHOD THEREOF

CROSS-REFERENCE TO RELATED APPLICATIONS

The present application is a continuation-in-part application of U.S. patent application Ser. No. 16/415,781 filed on May 17, 2019, which claims priority to U.S. Provisional Application No. 62/673,333, filed on May 18, 2018, and U.S. Provisional Application No. 62/838,137, filed on Apr. 24, 2019, the entire contents of which are incorporated herein by reference.

BACKGROUND

1. Field

Various embodiments of the present invention relate to a memory system.

2. Discussion of the Related Art

In the past, the semiconductor memory industry was able to produce a number of original good dies on a wafer, each of which has no defective memory cell through a semiconductor fabrication process. However, as the capacity of a memory increases, it becomes more difficult to fabricate a memory having no defective memory cell, and it is unlikely that such an error-free memory may be fabricated. As a way to overcome this concern, a repair method of replacing defective memory cells with redundancy memory cells included in a memory device, is being used.

As another way, an error occurred in a memory cell and an error occurred while data is transmitted in a read operation and a write operation of a memory system are corrected by using an error correction circuit (ECC circuit) which corrects an error in the memory system.

SUMMARY

Various embodiments are directed to providing a technology capable of improving error correction efficiency in a memory system.

In an embodiment, a memory system may include: a memory controller including: a system error correction code generation circuit configured to generate a first system error correction code based on write data, and generate a second system error correction code based on the write data and the first system error correction code; and a memory including: a memory error correction code generation circuit configured to generate a memory error correction code based on the write data and the first system error correction code transferred from the memory controller; and a memory core configured to store the write data, the first system error correction code, the second system error correction code and the memory error correction code.

In an embodiment, a method for operating a memory system including a memory controller and a memory may include: generating, by the memory controller, a first system error correction code based on write data; generating, by the memory controller, a second system error correction code based on the write data and the first system error correction code; transferring, by the memory controller, the write data, the first system error correction code and the second system error correction code to the memory; generating, by the memory, a memory error correction code based on the write data and the first system error correction code; and storing, by the memory, the write data, the first system error correction code, the second system error correction code and the memory error correction code in a memory core included in the memory.

In an embodiment, a memory system may include: a memory controller configured to generate a first system error correction code based on data to be written, and generate a second system error correction code based on the data and the first system error correction code, in a write operation; and a memory: in the write operation, configured to generate a memory error correction code based on the data and the first system error correction code transferred from the memory controller, and store the data, the first and second system error correction codes and the memory error correction code in a memory core included in the memory, and in a read operation, configured to correct an error of the data, the first and second system error correction codes which are read from the memory core, based on the second system error correction code and the memory error correction code which are read from the memory core, and transfer the error-corrected data and the error-corrected first and second system error correction codes to the memory controller.

In an embodiment, a memory may include: a memory core configured to store data and an error correction code corresponding to the data; a syndrome generator configured to generate a first syndrome by substituting the data and the error correction code, read from the memory core, into a first check matrix, and generate a second syndrome by substituting the data and the error correction code, read from the memory core, into a second check matrix; and an error correction unit configured to correct an error of the read data and error correction code by using the first syndrome and the second syndrome, wherein constituents having values of '1' in the first check matrix have values of '1' also in the second check matrix.

In an embodiment, a method for operating a memory may include: reading data and an error correction code corresponding to the data from a memory core; generating a first syndrome by substituting the data and the error correction code, read from the memory core, into a first check matrix; generating a pre-syndrome by substituting the data and the error correction code, read from the memory core, into [a second check matrix]-[the first check matrix]; generating the second syndrome by adding the pre-syndrome and the first syndrome; and correcting an error of the read data and error correction code by using the first syndrome and the second syndrome.

In an embodiment a memory system may include: a memory configured to output data and an error correction code corresponding to the data in a read operation; and a memory controller configured to control the memory, and receive the data and the error correction code from the memory in the read operation, wherein the memory controller comprises: a syndrome generator configured to generate a first syndrome by substituting the data and the error correction code into a first check matrix, and generate a second syndrome by substituting the data and the error correction code into a second check matrix; and an error correction unit configured to correct an error of the data by using the first syndrome and the second syndrome, and wherein constituents having values of '1' in the first check matrix have values of '1' also in the second check matrix.

According to the embodiments, error correction efficiency in a memory system may be improved.

BRIEF DESCRIPTION OF THE DRAWINGS

FIG. 6 is a diagram for describing a process for a system error correction code generation circuit shown in FIG. 4 to generate a first system error correction code.

FIG. 7 is a diagram for describing a process for the system error correction code generation circuit shown in FIG. 4 to generate a second system error correction code.

FIG. 8 is a diagram for describing a process for a memory error correction code generation circuit shown in FIG. 4 to generate a memory error correction code.

FIG. 9 is a diagram for describing a process for a memory error correction circuit shown in FIG. 4 to detect and correct an error.

FIG. 10 illustrates only components which are directly related with storage of data and error correction of data in the memory system 1000.

DETAILED DESCRIPTION

Figure 1:
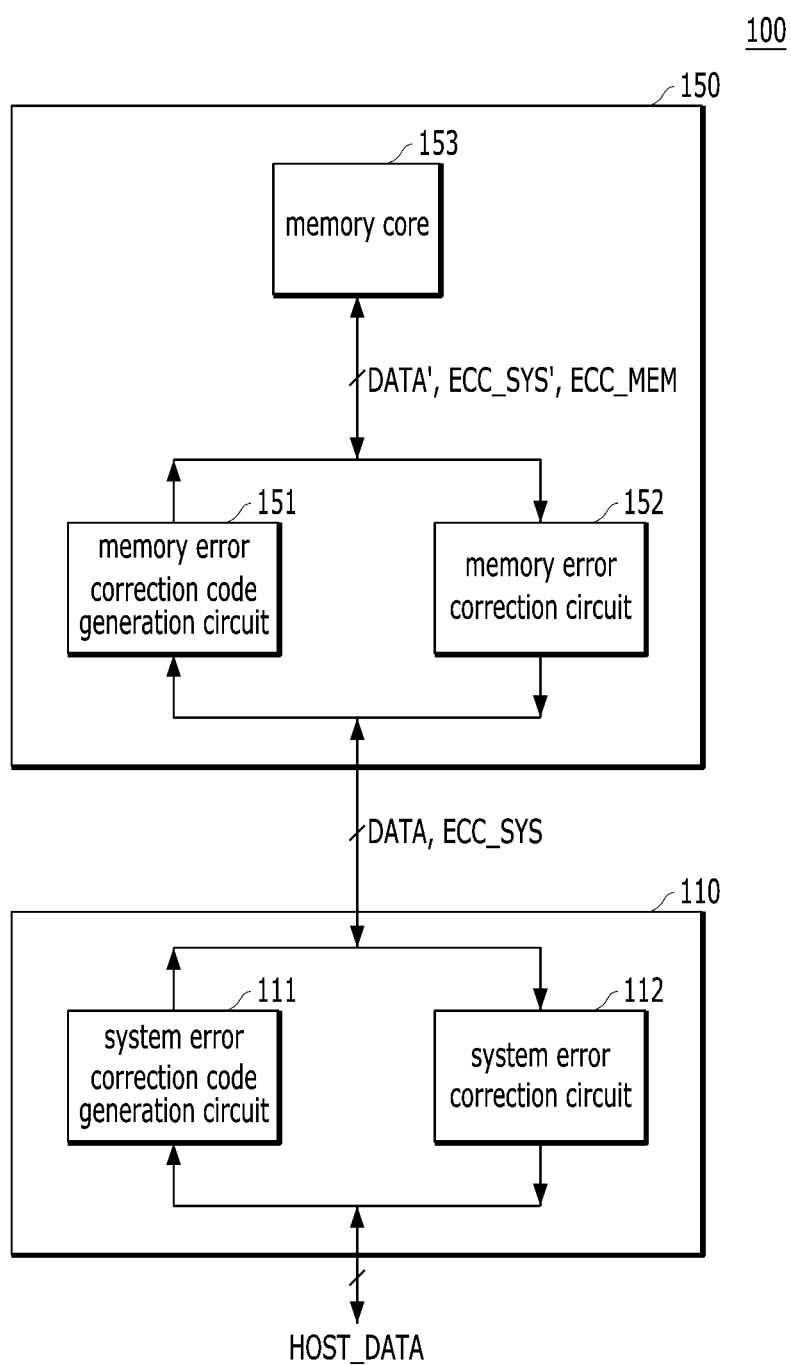
FIG. 1 is a block diagram illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s). Further, it will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

In the present disclosure, the singular forms are intended to include the plural forms as well, unless the context clearly indicates otherwise.

It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described embodiments are merely for the purpose of understanding the technical spirit of the present disclosure and the scope of the present disclosure should not be limited to the above-described embodiments. It will be obvious to those skilled in the art to which the present disclosure pertains that other modifications based on the technical spirit of the present disclosure may be made in addition to the above-described embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal. In addition, as used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

Hereinafter, the various embodiments of the present invention will be described in detail with reference to the attached drawings.

FIG. 1 is a diagram illustrating a memory system 100 in accordance with an embodiment of the present invention. FIG. 1 illustrates only components which are directly related to storage of data and error correction of data in the memory system 100.

Referring to FIG. 1, the memory system 100 may include a memory controller 110 and a memory 150.

The memory controller 110 may control the operations of the memory 150, such as read and write operations, according to a request of a host. The host may include a central processing unit (CPU), a graphic processing unit (GPU), an application processor (AP) or the like. The memory controller 110 may be embedded inside the host or may exist separately outside the host. In the case where the memory controller 110 is embedded inside the host, host data HOST_DATA in the drawing may represent data which the memory controller 110 communicates with the other components of the host in the host. In the case where the memory controller 110 exists outside the host, the host data HOST_DATA in the drawing may represent data which the memory controller 110 communicates with the host.

The memory controller 110 may include a system error correction code (ECC) generation circuit 111 and a system error correction circuit 112. The system ECC generation circuit 111 may generate a system error correction code ECC_SYS in a write operation. The system error correction circuit 112 may correct an error of data DATA by using the system error correction code ECC_SYS in a read operation.

The memory 150 may store write data DATA and the system error correction code ECC_SYS received from the memory controller 110 in the write operation, and may transfer read data DATA and the system error correction code ECC_SYS stored in the memory 150 to the memory controller 110 in the read operation. The memory 150 may be one of all types of memories such as a dynamic random access memory (DRAM), a high bandwidth memory (HBM), a phase change random access memory (PCRAM) and a flash memory. The memory 150 may include a memory error correction code (ECC) generation circuit 151, a memory error correction circuit 152 and a memory core 153. The memory ECC generation circuit 151 may generate a memory error correction code ECC_MEM in the write operation. The memory error correction circuit 152 may correct an error of data DATA' and a system error correction code ECC_SYS' by using the memory error correction code ECC_MEM in the read operation. The memory core 153 may include a cell array having a plurality of memory cells, and circuits for writing and reading data to and from the cell array.

Figure 2:
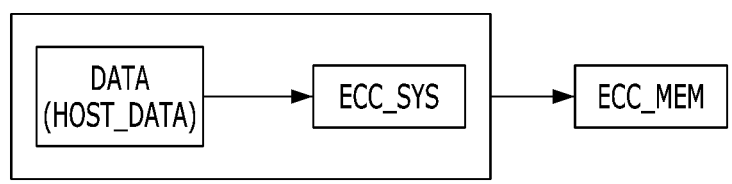
FIG. 2 is a diagram illustrating an encoding target in the memory system shown in FIG. 1.

The system ECC generation circuit 111 of the memory controller 110 may generate the system error correction code ECC_SYS for correcting an error, based on the data HOST_DATA transferred from the host in the write operation. That is to say, the system ECC generation circuit 111 may generate the system error correction code ECC_SYS for correcting an error of the data HOST_DATA by encoding the data HOST_DATA. In the write operation, since the system error correction code ECC_SYS is only generated and an error correction operation is not performed, the data HOST_DATA transferred from the host and the data DATA transferred from the memory controller 110 to the memory 150 may be the same. Referring to FIG. 2, it may be seen that the system error correction code ECC_SYS is generated by encoding the data DATA, that is, an error of the data DATA is covered by the system error correction code ECC_SYS.

The memory ECC generation circuit 151 of the memory 150 may generate the memory error correction code ECC_MEM for correcting an error, based on the data DATA and the system error correction code ECC_SYS transferred from the memory controller 110 in the write operation. In other words, the memory ECC generation circuit 151 may generate the memory error correction code ECC_MEM for correcting an error of the data DATA and the system error correction code ECC_SYS, by encoding the data DATA and the system error correction code ECC_SYS. In the write operation, since only the memory error correction code ECC_MEM is generated and an error correction operation is not performed, the data DATA and the system error correction code ECC_SYS inputted to the memory ECC generation circuit 151 and the data DATA' and the system error correction code ECC_SYS' outputted from the memory ECC generation circuit 151 may be the same. Referring to FIG. 2, it may be seen that the memory error correction code ECC_MEM is generated by encoding the data DATA and the system error correction code ECC_SYS, that is, an error of the data DATA and the system error correction code ECC_SYS is covered by the memory error correction code ECC_MEM.

In the write operation, the data DATA', the system error correction code ECC_SYS' and the memory error correction code ECC_MEM may be stored in the cell array of the memory core 153.

In the read operation, the data DATA', the system error correction code ECC_SYS' and the memory error correction code ECC_MEM may be read from the cell array of the memory core 153 and be transferred to the memory error correction circuit 152.

The memory error correction circuit 152 of the memory 150 may correct an error of the data DATA' and the system error correction code ECC_SYS' based on the memory error correction code ECC_MEM. The data DATA and the system error correction code ECC_SYS which are error-corrected by the memory error correction circuit 152 may be transferred to the memory controller 110.

The system error correction circuit 112 of the memory controller 110 may correct an error of the data DATA transferred from the memory 150, based on the system error correction code ECC_SYS transferred from the memory 150. The data HOST_DATA which is error-corrected by the system error correction circuit 112 may be transferred to the host.

The generation of the system error correction code ECC_SYS and the error correction operation by the system ECC generation circuit 111 and the system error correction circuit 112 of the memory controller 110 may be performed by the memory controller 110 capable of self-scheduling a time. Namely, the memory controller 110 may self-secure a sufficient time required for error correction. On the other hand, since the memory 150 needs to perform an operation instructed by the memory controller 110 within a preset time, it is impossible for the memory 150 to self-schedule a time. Thus, in most cases, the generation of the memory error correction code ECC_MEM and the error correction operation by the memory ECC generation circuit 151 and the memory error correction circuit 152 of the memory 150 are performed as hidden in a short time. That is to say, the memory controller 110 may not be aware that the additional memory error correction code ECC_MEM is stored in the memory 150, and may not be aware that the error correction operation is performed internally at the memory 150. Moreover, since the memory 150 needs to self-secure an additional capacity for storing the memory error correction code ECC_MEM, the bit number of the memory error correction code ECC_MEM cannot help but be relatively small.

Because the error correction operation of the memory error correction circuit 152 needs to be performed as hidden in a short time and the bit number of the memory error correction code ECC_MEM is small, the error detection and error correction capability of the memory error correction circuit 152 is inevitably inferior to that of the system error correction circuit 112. For example, while the system error correction circuit 112 may detect and correct an error of 1 symbol (1 symbol is multiple bits), the memory error correction circuit 152 may detect and correct an error of only 1 bit.

In the case where the error detection and error correction capability of the memory error correction circuit 152 is inferior to that of the system error correction circuit 112, the operation of the memory error correction circuit 152 may rather cause a concern in the operation of the system error correction circuit 112. This will be described below with reference to FIGS. 3A and 3B. In the following description, it is assumed that the data DATA is 32 bits, the system error correction code ECC_SYS is 8 bits and 1 symbol is 4 bits. Further, it is assumed that the system error correction circuit 112 may detect and correct an error of 1 symbol and the memory error correction circuit 152 may detect and correct an error of 1 bit.

Figure 3A:
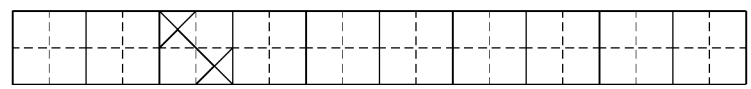
FIGS. 3A and 3B are diagrams for describing a possible concern of error correction in the memory system shown in FIG. 1.

FIG. 3A illustrates the data DATA' of 32 bits and the system error correction code ECC_SYS' of 8 bits, read from the memory core 153 of the memory 150. Parts partitioned by solid lines may represent 10 symbols, and parts partitioned by dotted lines in each of the symbols may represent data of 4 bits included in the corresponding symbol. The 2 bits denoted by 'X' in the drawing may represent error bits. Referring to FIG. 3A, it may be seen that errors of 2 bits are included in one symbol.

Figure 3B:
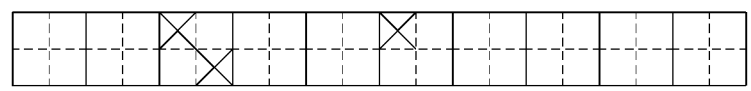

FIG. 3B illustrates the data DATA and the system error correction code ECC_SYS after the memory error correction circuit 152 performs the error correction operation for the data DATA' and the system error correction code ECC_SYS' of FIG. 3A based on the memory error correction code ECC_MEM. It may be seen that, since the number of errors exceeds 1 bit as the number of error bits which may be detected and corrected by the memory error correction circuit 152, an additional error of 1 bit is rather increased by the error correction operation of the memory error correction circuit 152. While errors of 2 bits are included in one symbol in FIG. 3A, it may be seen from FIG. 3B that errors of 2 bits are included in the same symbol as in FIG. 3A and an error of 1 bit is included in another symbol due to the malfunction of the memory error correction circuit 152.

The error correction operation of the memory error correction circuit 152, as shown in FIGS. 3B and 3A, may cause an error in the operation of the memory system 100. In FIG. 3A, since errors are included in one symbol, the errors may be corrected by the error correction operation of the system error correction circuit 112 of the memory controller 110. However, in FIG. 3B, since errors are included in two symbols, the errors may not be corrected even by the error correction operation of the system error correction circuit 112. In other words, there may be a concern with certain errors, which may be corrected by the system error correction circuit 112 if the error correction operation of the memory error correction circuit 152 is not performed, may not be corrected even by the system error correction circuit 112, due to the error correction operation of the memory error correction circuit 152.

In order to prevent such concern, the error detection capability of the memory error correction circuit 152 needs to be equal to or greater than the error detection capability of the system error correction circuit 112. Namely, even though the memory error correction circuit 152 may not correct an error, when the error occurs, the memory error correction circuit 152 needs to be able to figure out whether the error is an error which is correctable by itself or exceeds its correction capability. For example, when the errors as in FIG. 3A occur, if the memory error correction circuit 152 detects that errors of 2 bits have occurred, determines that the errors cannot be corrected by itself and transfers the data DATA' and the system error correction code ECC_SYS' to the system error correction circuit 112 as they are, the concern that the number of errors increases as shown in FIG. 3B may not be caused.

In order to increase the error detection capability of the memory error correction circuit 152, the bit number of the memory error correction code ECC_MEM needs to be increased. To this end, an additional capacity for storing the memory error correction code ECC_MEM needs to be secured in the memory 150, which is not easy to achieve. The above concern may be resolved also in the case where the error correction capability of the memory error correction circuit 152 is equal to or greater than that of the system error correction circuit 112. However, since it is not easy to secure a sufficient error correction time in the memory 150, actually, it is more difficult to increase the error correction capability of the memory error correction circuit 152.

Figure 4:
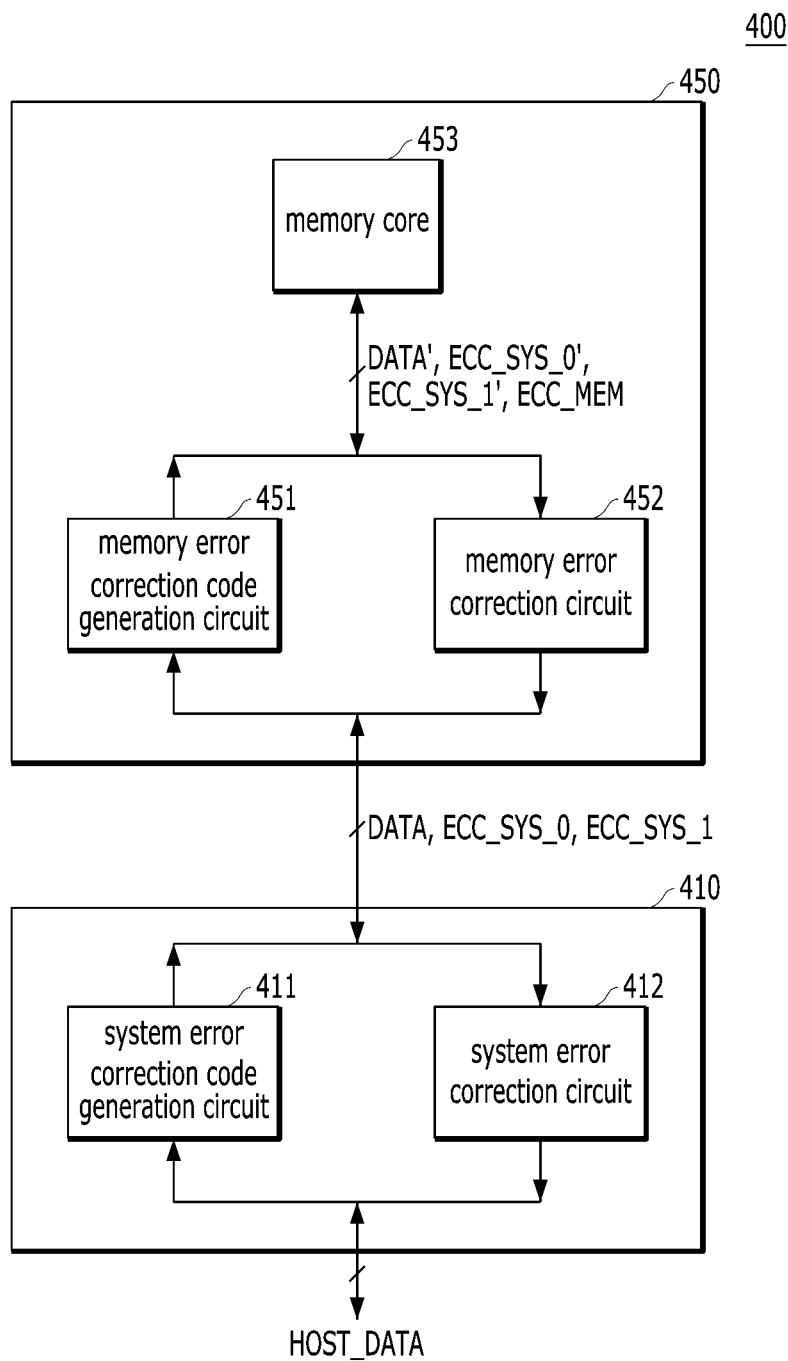
FIG. 4 is a block diagram illustrating a memory system in accordance with an embodiment the present invention.

FIG. 4 is a block diagram illustrating a memory system 400 in accordance with an embodiment of the present invention. FIG. 4 illustrates only components which are directly related to storage of data and error correction of data in the memory system 400.

Referring to FIG. 4, the memory system 400 may include a memory controller 410 and a memory 450.

The memory controller 410 may control the operations of the memory 150, such as read and write operations, according to a request of a host. The host may include a CPU, a GPU, an AP or the like. The memory controller 410 may be embedded inside the host or may exist separately outside the host. In the case where the memory controller 410 is embedded inside the host, host data HOST_DATA in the drawing may represent data which the memory controller 410 communicates with the other components of the host in the host. In the case where the memory controller 410 exists outside the host, the host data HOST_DATA in the drawing may represent data which the memory controller 410 communicates with the host. The memory controller 410 may include a system error correction code (ECC) generation circuit 411 and a system error correction circuit 412. The system error correction code (ECC) generation circuit 411 may generate a first system error correction code ECC_SYS_0 and a second system error correction code ECC_SYS_1 in a write operation. The system error correction circuit 412 may perform an error correction operation by using the first system error correction code ECC_SYS_0 and the second system error correction code ECC_SYS_1 in a read operation.

The memory 450 may store write data DATA, the first system error correction code ECC_SYS_0 and the second system error correction code ECC_SYS_1 received from the memory controller 410 in the write operation, and may transfer read data DATA, the first system error correction code ECC_SYS_0 and the second system error correction code ECC_SYS_1 stored in the memory 450 to the memory controller 410 in the read operation. The memory 450 may be one of all types of memories such as a DRAM, an HBM, a PCRAM and a flash memory. The memory 450 may include a memory error correction code (ECC) generation circuit 451, a memory error correction circuit 452 and a memory core 453. The memory ECC generation circuit 451 may generate a memory error correction code ECC_MEM in the write operation. The memory error correction circuit 452 may correct an error of data DATA', a first system error correction code ECC_SYS_0' and a second system error correction code ECC_SYS_1' based on the second system error correction code ECC_SYS_1' and the memory error correction code ECC_MEM in the read operation. The memory core 453 may include a cell array having a plurality of memory cells, and circuits for writing and reading data to and from the cell array.

Figure 5:
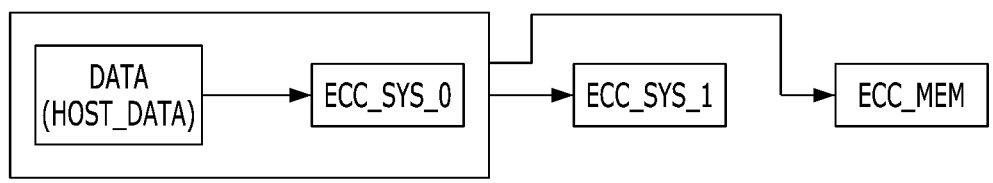
FIG. 5 is a diagram illustrating an encoding target in the memory system shown in FIG. 4.

The system ECC generation circuit 411 of the memory controller 410 may generate the first system error correction code ECC_SYS_0 based on the data HOST_DATA transferred from the host in the write operation. Further, the system ECC generation circuit 411 of the memory controller 410 may generate the second system error correction code ECC_SYS_1 by using the data HOST_DATA and the first system error correction code ECC_SYS_0. In the write operation, since the first system error correction code ECC_SYS_0 and the second system error correction code ECC_SYS_1 are only generated and an error correction operation is not performed, the data HOST_DATA transferred from the host and the data DATA transferred from the memory controller 410 to the memory 450 may be the same. Referring to FIG. 5, it may be seen that the first system error correction code ECC_SYS_0 is generated by encoding the data HOST_DATA and the second system error correction code ECC_SYS_1 is generated by encoding the data DATA and the first system error correction code ECC_SYS_0.

The memory ECC generation circuit 451 of the memory 450 may generate the memory error correction code ECC_

MEM based on the data DATA and the first system error correction code ECC_SYS_0 transferred from the memory controller 410 in the write operation. In other words, the memory ECC generation circuit 451 may generate the memory error correction code ECC_MEM for correcting an error of the data DATA and the first system error correction code ECC_SYS_0, by encoding the data DATA and the first system error correction code ECC_SYS_0. In the write operation, since the memory error correction code ECC_MEM is only generated and an error correction operation is not performed, the data DATA and the first system error correction code ECC_SYS_0 inputted to the memory ECC generation circuit 451 and the data DATA' and the first system error correction code ECC_SYS_0' outputted from the memory ECC generation circuit 451 may be the same. The memory ECC generation circuit 451 may not use the second system error correction code ECC_SYS_1 in generation of the memory error correction code ECC_MEM. Namely, the memory ECC generation circuit 451 may bypass the second system error correction code ECC_SYS_1 as it is transferred from the memory controller 410. Therefore, in the write operation, the second system error correction code ECC_SYS_1 inputted to the memory ECC generation circuit 451 and the second system error correction code ECC_SYS_1' outputted from the memory ECC generation circuit 451 may be the same. Referring to FIG. 5, it may be seen that the memory error correction code ECC_MEM is generated by encoding the data DATA and the first system error correction code ECC_SYS_0. It may be seen that the second system error correction code ECC_SYS_1 is generated by the system ECC generation circuit 411 and the memory error correction code ECC_MEM is generated by the memory ECC generation circuit 451, but the encoding targets of the two codes ECC_SYS_1 and ECC_MEM are the same.

In the write operation, the data DATA', the first system error correction code ECC_SYS_0', the second system error correction code ECC_SYS_1' and the memory error correction code ECC_MEM may be stored in the cell array of the memory core 453.

In the read operation, the data DATA', the first system error correction code ECC_SYS_0', the second system error correction code ECC_SYS_1' and the memory error correction code ECC_MEM may be read from the memory core 453 and be transferred to the memory error correction circuit 452.

The memory error correction circuit 452 of the memory 450 may correct an error of the data DATA', the first system error correction code ECC_SYS_0' and the second system error correction code ECC_SYS_1' by using the second system error correction code ECC_SYS_1' and the memory error correction code ECC_MEM. Although an error of the memory error correction code ECC_MEM may also be corrected, because the memory error correction code ECC_MEM is not used but discarded by the memory error correction circuit 452, and thus the error correction of the memory error correction code ECC_MEM may be omitted. Since the memory error correction circuit 452 uses not only the memory error correction code ECC_MEM but also the second system error correction code ECC_SYS_1', the memory error correction circuit 452 may perform error detection and correction operations using an error correction code of a larger number of bits. That is to say, the memory error correction circuit 452 may have better error detection and correction capability than the memory error correction circuit 152 which uses only the memory error correction code ECC_MEM as illustrated in FIG. 1. The data DATA', the first system error correction code ECC_SYS_0' and the second system error correction code ECC_SYS_1' which are error-corrected by the memory error correction circuit 452 may be transferred to the memory controller 410. In the case where an error greater than the error correction capability of the memory error correction circuit 452 is detected by the memory error correction circuit 452, the memory 450 may notify the memory controller 410 that an error has occurred.

Here, the fact that an error of the data DATA', the first system error correction code ECC_SYS_0' and the second system error correction code ECC_SYS_1' is corrected means that an error correction process for detecting and correcting the error thereof is performed by the memory error correction circuit 452, and does not mean that the error thereof is necessarily corrected. For example, in the case where an error thereof is not detected by the memory error correction circuit 452, the error may not be corrected.

The system error correction circuit 412 of the memory controller 410 may correct an error of the data DATA transferred from the memory 450, based on the first system error correction code ECC_SYS_0 and the second system error correction code ECC_SYS_1 transferred from the memory 450. The data HOST_DATA which is error-corrected by the system error correction circuit 412 may be transferred to the host. Here, the fact that an error of the data HOST_DATA is corrected means that the data HOST_DATA is generated as an error correction process for the data DATA is performed by the system error correction circuit 412, and does not mean that the error is necessarily corrected.

As described above with reference to FIGS. 3A and 3B, in order for the error correction operation of the memory error correction circuit 452 not to cause a concern in the error correction operation of the system error correction circuit 412, the error detection capability of the memory error correction circuit 452 needs to be equal to or greater than the error detection capability of the system error correction circuit 412. To this end, it may be essential that the number of bits of an error correction code to be used in the memory error correction circuit 452 be increased. In the embodiment of FIG. 4, since the memory error correction circuit 452 uses not only the memory error correction code ECC_MEM generated in the memory ECC generation circuit 451 but also a part (i.e., ECC_SYS_1') of the system error correction codes ECC_SYS_0' and ECC_SYS_1' generated in the system ECC generation circuit 411, it may be easy to design the memory error correction circuit 452 to have the error detection capability equal to or greater than that of the system error correction circuit 412.

Figure 6:
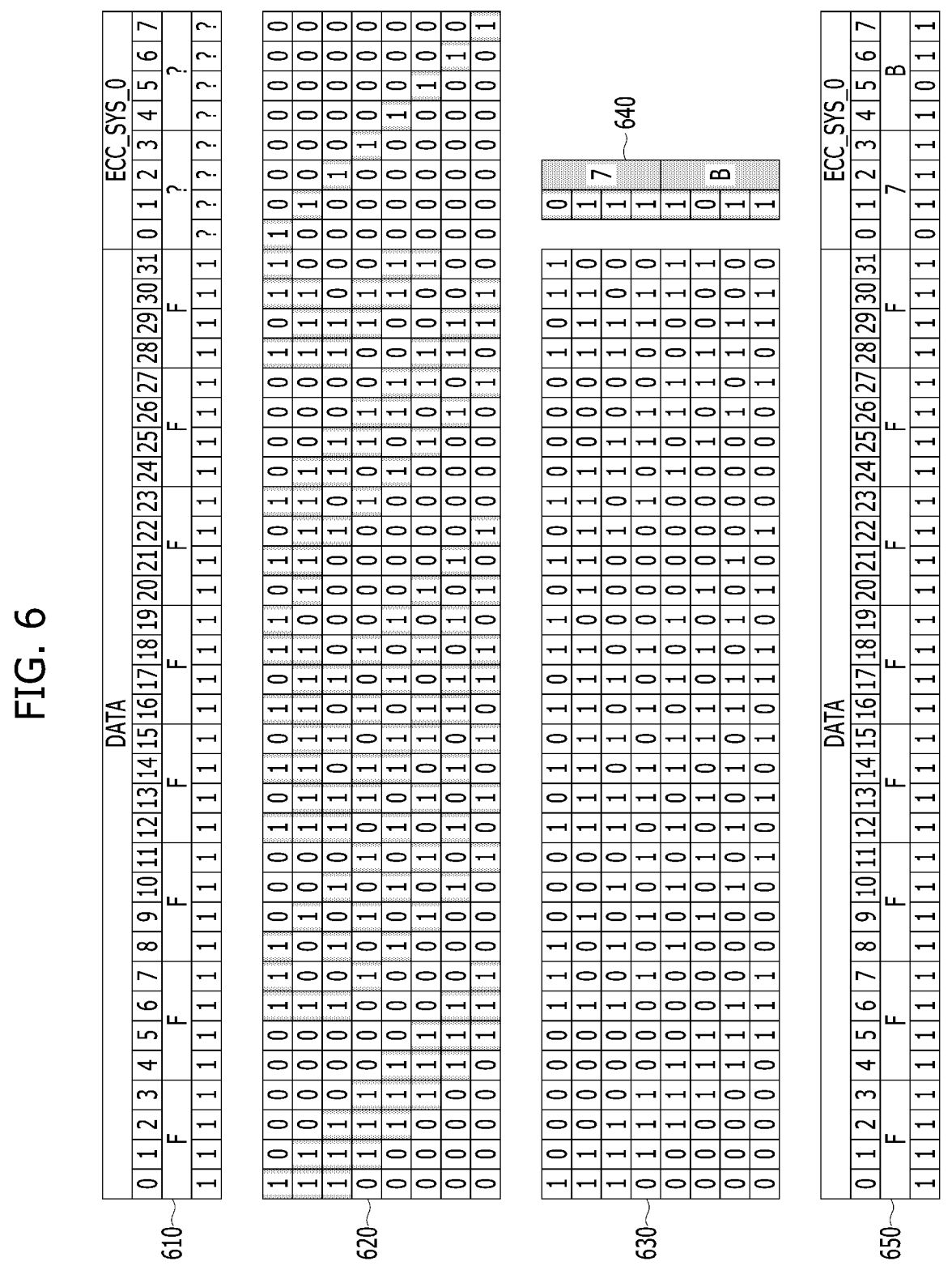
Figure 7:
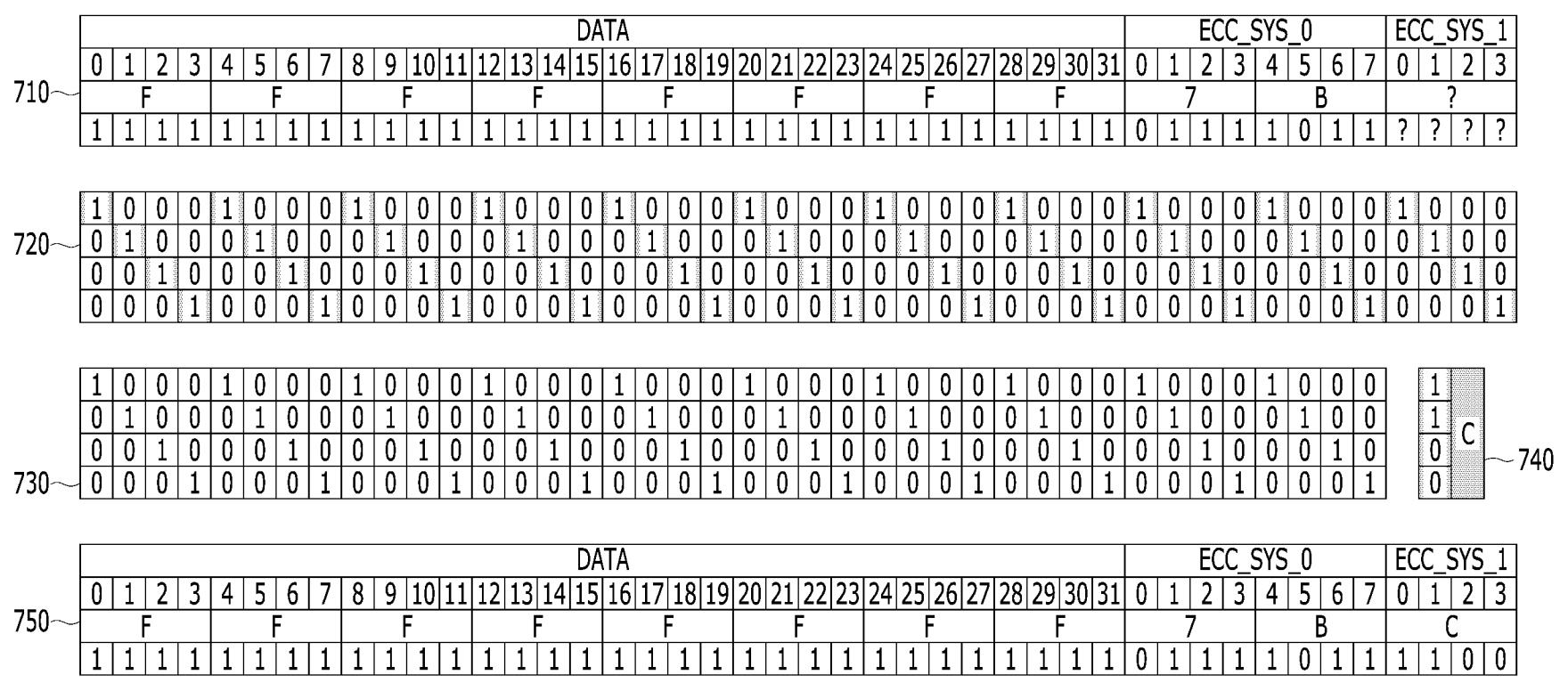
Figure 8:
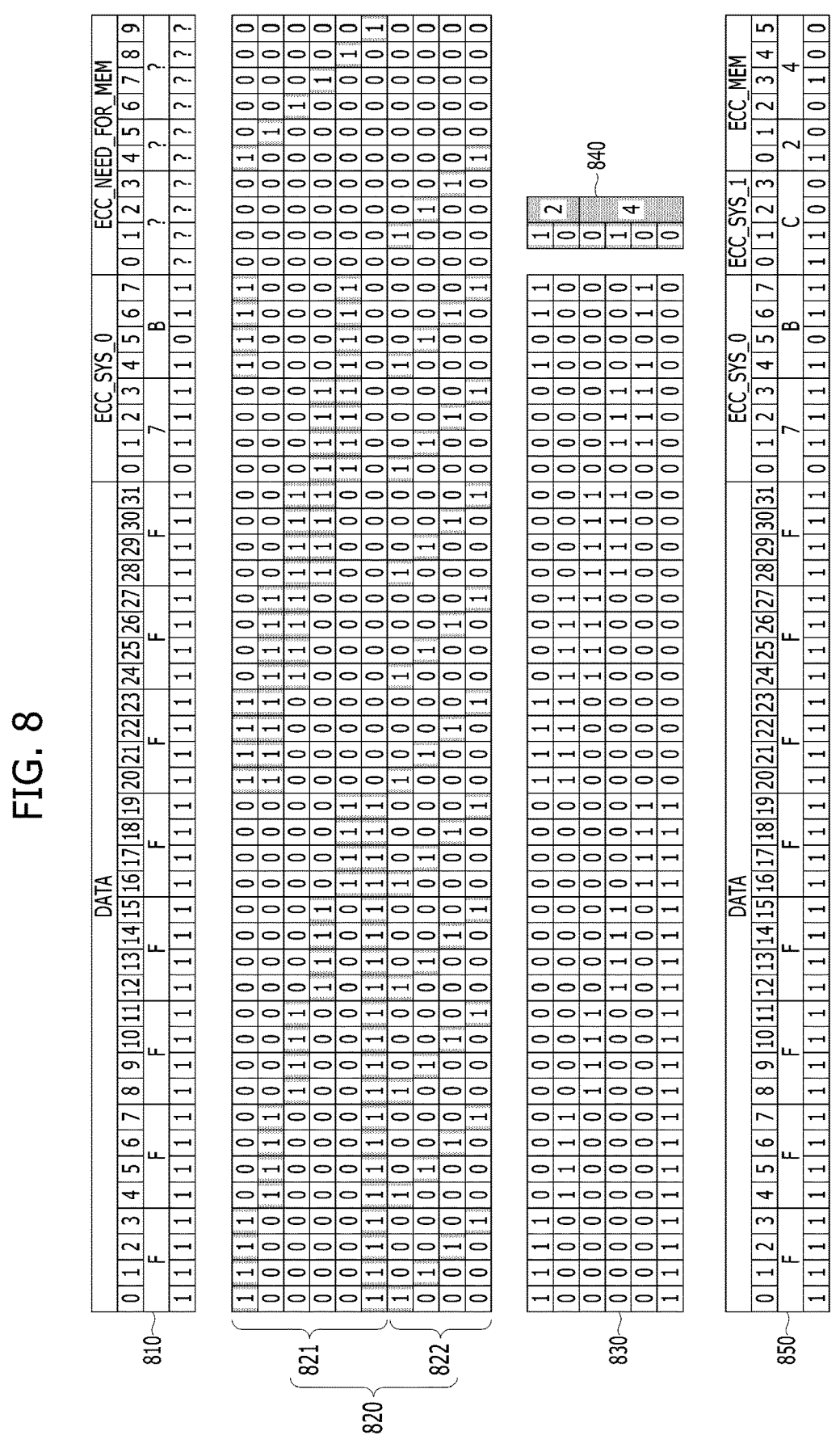

FIGS. 6 to 8 are diagrams for describing a process of generating the error correction codes ECC_SYS_0, ECC_SYS_1 and ECC_MEM.

FIG. 6 is a diagram for describing a process for the system ECC generation circuit 411 to generate the first system error correction code ECC_SYS_0 by encoding the data DATA. While FIG. 4 illustrates that the data DATA_HOST is inputted to the system ECC generation circuit 411, since the data DATA_HOST and the data DATA may be the same in the write operation, for the sake of convenience in explanation, FIG. 6 illustrates that the system ECC generation circuit 411 generates the first system error correction code ECC_SYS_0 by encoding the data DATA.

'610' of FIG. 6 may represent the data DATA of 32 bits and the first system error correction code ECC_SYS_0 of 8 bits that is to be generated using the data DATA of 32 bits. '0' to '31' may denote the respective bits of the data DATA, and '0' to '7' may denote the respective bits of the first system error correction code ECC_SYS_0. The data DATA may include 8 symbols, and each symbol may include data of 4 bits. For each symbol, the 4-bit data of a corresponding symbol is denoted by a hexadecimal number. In '610', since all the data DATA of 32 bits are illustrated as having the value of '1', each symbol may have a value of a hexadecimal number 'F'. The first system error correction code ECC_SYS_0 may include 2 symbols. Since the first system error correction code ECC_SYS_0 is not generated yet, the respective bits of the first system error correction code ECC_SYS_0 are denoted by '?'.

'620' of FIG. 6 may represent a check matrix for generation of the first system error correction code ECC_SYS_0.

'630' of FIG. 6 may represent a result of performing a calculation on the data 610 by using the check matrix 620. In the check matrix 620, portions whose values are '1' are significant. In the case where data 610 existing at the same x-axis as a portion whose value is '1' in the check matrix 620 is '1', the value of a corresponding portion may be calculated as '1'. In the case where data 610 existing at the same x-axis as a portion whose value is '1' in the check matrix 620 is '0', the value of a corresponding portion may be calculated as '0'. Since all the data 610 are illustrated as '1', '630' may be generated in the same form as the check matrix 620.

'640' of FIG. 6 illustrates a process of generating the first system error correction code ECC_SYS_0 by using the calculation result 630. Referring to '640', it may be seen that the respective bits of the first system error correction code ECC_SYS_0 are generated depending on whether the number of '1's existing on the same y-axis in '630' is even or odd. In the case where the number of '1's existing on the same y-axis in '630' is even, a corresponding bit of the first system error correction code ECC_SYS_0 may be generated as '0', and in the case where the number of '1's existing on the same y-axis in '630' is odd, a corresponding bit of the first system error correction code ECC_SYS_0 may be generated as '1'. Referring to '640', it may be seen that the first system error correction code ECC_SYS_0 is generated as (0,1,1,1,1,0,1,1). In '640', '7' and 'B' denote the first system error correction code ECC_SYS_0 in hexadecimal numbers by the unit of symbol.

'650' of FIG. 6 illustrates together the data DATA of 32 bits (i.e., 8 symbols) and the first system error correction code ECC_SYS_0 of 8 bits (i.e., 2 symbols) generated by encoding the data DATA. By performing a calculation through substituting '650' into the check matrix 620, it may be seen that, when summing the numbers of '1's existing on the same y-axis, all the numbers are even.

The first system error correction code ECC_SYS_0 generated in the manner illustrated in FIG. 6 is also referred to as a cyclic redundancy check (CRC) code.

FIG. 7 is a diagram for describing a process for the system ECC generation circuit 411 to generate the second system error correction code ECC_SYS_1 by encoding the data DATA and the first system error correction code ECC_SYS_0.

'710' of FIG. 7 may represent the data DATA and the first system error correction code ECC_SYS_0 as encoding targets for generation of the second system error correction code ECC_SYS_1, and the second system error correction code ECC_SYS_1 generated by encoding them DATA and ECC_SYS_0.

'720' of FIG. 7 may represent a check matrix for generation of the second system error correction code ECC_SYS_1.

'730' of FIG. 7 may represent a result of performing a calculation on the data DATA and the first system error correction code ECC_SYS_0 by using the check matrix 720. The calculation may be performed in the same manner as in '630' of FIG. 6.

'740' of FIG. 7 illustrates a process of generating the second system error correction code ECC_SYS_1 by using the calculation result 730. The generation of the second system error correction code ECC_SYS_1 in '740' may be performed in the same manner as the generation of the first system error correction code ECC_SYS_0 in '640'. Referring to '740', it may be seen that the second system error correction code ECC_SYS_1 is generated as (1,1,0,0). 'C' of '740' represents the second system error correction code ECC_SYS_1 in a hexadecimal number.

The first bit of the second system error correction code ECC_SYS_1 may represent whether the number of bits having the value of '1' among the first bits of the respective symbols of the data DATA and the first system error correction code ECC_SYS_0 is even or odd, the second bit of the second system error correction code ECC_SYS_1 may represent whether the number of bits having the value of '1' among the second bits of the respective symbols of the data DATA and the first system error correction code ECC_SYS_0 is even or odd, the third bit of the second system error correction code ECC_SYS_1 may represent whether the number of bits having the value of '1' among the third bits of the respective symbols of the data DATA and the first system error correction code ECC_SYS_0 is even or odd, and the fourth bit of the second system error correction code ECC_SYS_1 may represent whether the number of bits having the value of '1' among the fourth bits of the respective symbols of the data DATA and the first system error correction code ECC_SYS_0 is even or odd. In other words, each bit of the second system error correction code ECC_SYS_1 may represent whether the number of bits having the value of '1' among the bits of the same position in the symbols of the data DATA and the first system error correction code ECC_SYS_0 is even or odd. A code such as the second system error correction code ECC_SYS_1 is generally referred to as a simple parity code.

'750' of FIG. 7 illustrates together the data DATA, the first system error correction code ECC_SYS_0 and the second system error correction code ECC_SYS_1 generated by encoding them DATA and ECC_SYS_0. By performing a calculation through substituting '750' into the check matrix 720, it may be seen that, when summing the numbers of '1's existing on the same y-axis, all the numbers are even.

When the system error correction circuit 412 of the memory controller 410 corrects an error of the data DATA by using the first system error correction code ECC_SYS_0 and the second system error correction code ECC_SYS_1, through using the first system error correction code ECC_SYS_0 and the second system error correction code ECC_SYS_1 as illustrated in FIG. 7, the system error correction circuit 412 may detect and correct an error of 1 symbol in the data DATA.

FIG. 8 is a diagram for describing a process for the memory ECC generation circuit 451 to generate the memory error correction code ECC_MEM by encoding the data DATA and the first system error correction code ECC_SYS_0.

'810' of FIG. 8 may represent the data DATA and the first system error correction code ECC_SYS_0 as encoding targets for generation of the memory error correction code ECC_MEM, and a code ECC_NEED_FOR_MEM needed for the memory error correction circuit 452 to generate the memory error correction code ECC_MEM by encoding them DATA and ECC_SYS_0. By using the code ECC_NEED_FOR_MEM of 10 bits, the memory error correction circuit 452 may correctly detect successive errors of 4 bits, and is able to correct an error of 1 bit. Namely, by using the code ECC_NEED_FOR_MEM of 10 bits, the memory error correction circuit 452 may have error detection capability equal to or greater than that of the system error correction circuit 412.

'820' of FIG. 8 may represent a check matrix for generation of the code ECC_NEED_FOR_MEM of 10 bits. By observing the check matrix 820, it may be seen that a portion 821 corresponding to a code of 6 bits is new but a portion 822 corresponding to a code of 4 bits is perfectly the same as the check matrix 720. That is to say, 4 bits of the code ECC_NEED_FOR_MEM of 10 bits are perfectly the same as the second system error correction code ECC_SYS_1. Since 4 bits in the code ECC_NEED_FOR_MEM of 10 bits needed for the memory error correction circuit 452 are already generated by the system ECC generation circuit 411, the memory error correction code generation circuit 451 may generate only the remaining 6 bits in the code ECC_NEED_FOR_MEM of 10 bits. The code of these 6 bits may be the memory error correction code ECC_MEM.

'830' of FIG. 8 may represent a result of performing a calculation on the data DATA and the first system error correction code ECC_SYS_0 by using the portion 821 of the check matrix 820. The calculation may be performed in the same manner as in '630' of FIG. 6.

'840' of FIG. 8 illustrates a process of generating the memory error correction code ECC_MEM by using the calculation result 830. The generation of the memory error correction code ECC_MEM in '840' may be performed in the same manner as the generation of the first system error correction code ECC_SYS_0 in '640'. Referring to '840', it may be seen that the memory error correction code ECC_MEM is generated as (1,0,0,1,0,0) corresponding to values '2' and '4'.

'850' of FIG. 8 illustrates together the data DATA, the first system error correction code ECC_SYS_0, the second system error correction code ECC_SYS_1 and the memory error correction code ECC_MEM generated by the memory ECC generation circuit 451.

Figure 9:
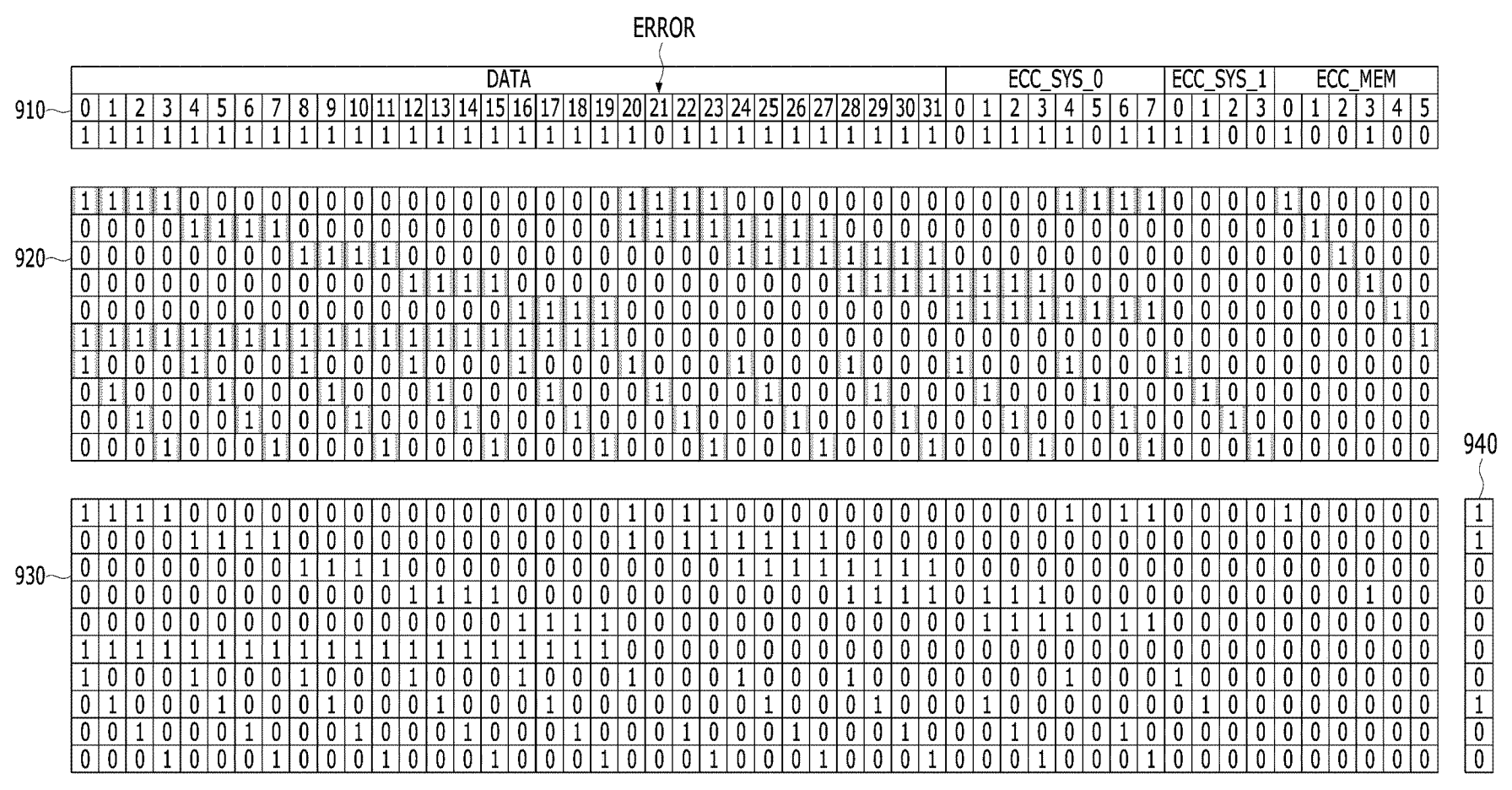

FIG. 9 is a diagram for describing a process for the memory error correction circuit 452 to detect and correct an error by using the second system error correction code ECC_SYS_1' and the memory error correction code ECC_MEM. The memory error correction circuit 452 may correct an error of up to 1 bit and may detect an error of up to successive 4 bits.

'910' of FIG. 9 represents the data DATA', the first system error correction code ECC_SYS_0', the second system error correction code ECC_SYS_1' and the memory error correction code ECC_MEM which are read from the memory core 453. Referring to '910,' it may be seen that an error in which 21 among 0 to 31 of the data DATA' is changed to '0' exists.

'920' of FIG. 9 may represent a check matrix which the memory error correction circuit 452 uses to correct an error. The check matrix 920 may be the same as the check matrix 820 shown in FIG. 8.

'930' of FIG. 9 may represent a result of performing a calculation on the data DATA', the first system error correction code ECC_SYS_0', the second system error correction code ECC_SYS_1' and the memory error correction code ECC_MEM, by using the check matrix 920. This calculation may be performed in the same manner as in '630'.

'940' of FIG. 9 may represent whether the number of '1's on the same y-axis in the calculation result 930 is odd or even. In this case, '940' may be generated as (1,1,0,0,0,0,0,1,0,0) indicating the position of an error. In the check matrix 920, a portion corresponding to (1,1,0,0,0,0,0,1,0,0) corresponds to '21' among '0' to '31' of the data DATA, and indicates the position of an error. The memory error correction circuit 452 may correct an error by inverting an error portion. The series of calculation processes of '930' and '940' are referred to as a syndrome calculation.

In the case where the calculation result 940 is (0,0,0,0,0,0,0,0,0,0), it may be indicated that there is no error. In the case where the calculation result 940 is not (0,0,0,0,0,0,0,0,0,0) and a portion the same as the calculation result 940 does not exist in the check matrix 920, it may be indicated that an error uncorrectable by the memory error correction circuit 452 has occurred, that is, errors of 2 or more bits have occurred.

Hereunder, a process for the system error correction circuit 412 to correct an error will be described. The system error correction circuit 412 may detect an error by using the first system error correction code ECC_SYS_0, that is, the CRC code, and may correct an error of the data DATA in such a way to restore a symbol by using the second system error correction code ECC_SYS_1, that is, the simple parity code. To this end, a series of operations may be repeated until no error is detected. The series of operations may include, for example, (1) detecting whether there is an error, through a CRC calculation using the first system error correction code ECC_SYS_0, (2) restoring a first symbol through parity calculation using the second system error correction code ECC_SYS_1 while assuming that an error exists in the first symbol of the data DATA, (3) detecting whether there is an error, through a CRC calculation using the first system error correction code ECC_SYS_0 with the first symbol of the data DATA restored, (4) restoring the second symbol through parity calculation using the second system error correction code ECC_SYS_1 while assuming that an error exists in the second symbol of the data DATA, (5) detecting whether there is an error, through a CRC calculation using the first system error correction code ECC_SYS_0 with the second symbol of the data DATA restored, (6) restoring the third symbol by parity calculation using the second system error correction code ECC_SYS_1 while assuming that an error exists in the third symbol of the data DATA, and (7) detecting whether there is an error, through a CRC calculation using the first system error correction code ECC_SYS_0 with the third symbol of the data DATA restored may be repeated until an error is not detected. In this way, the system error correction circuit 412 is able to correct an error of 1 symbol.

Figure 10:
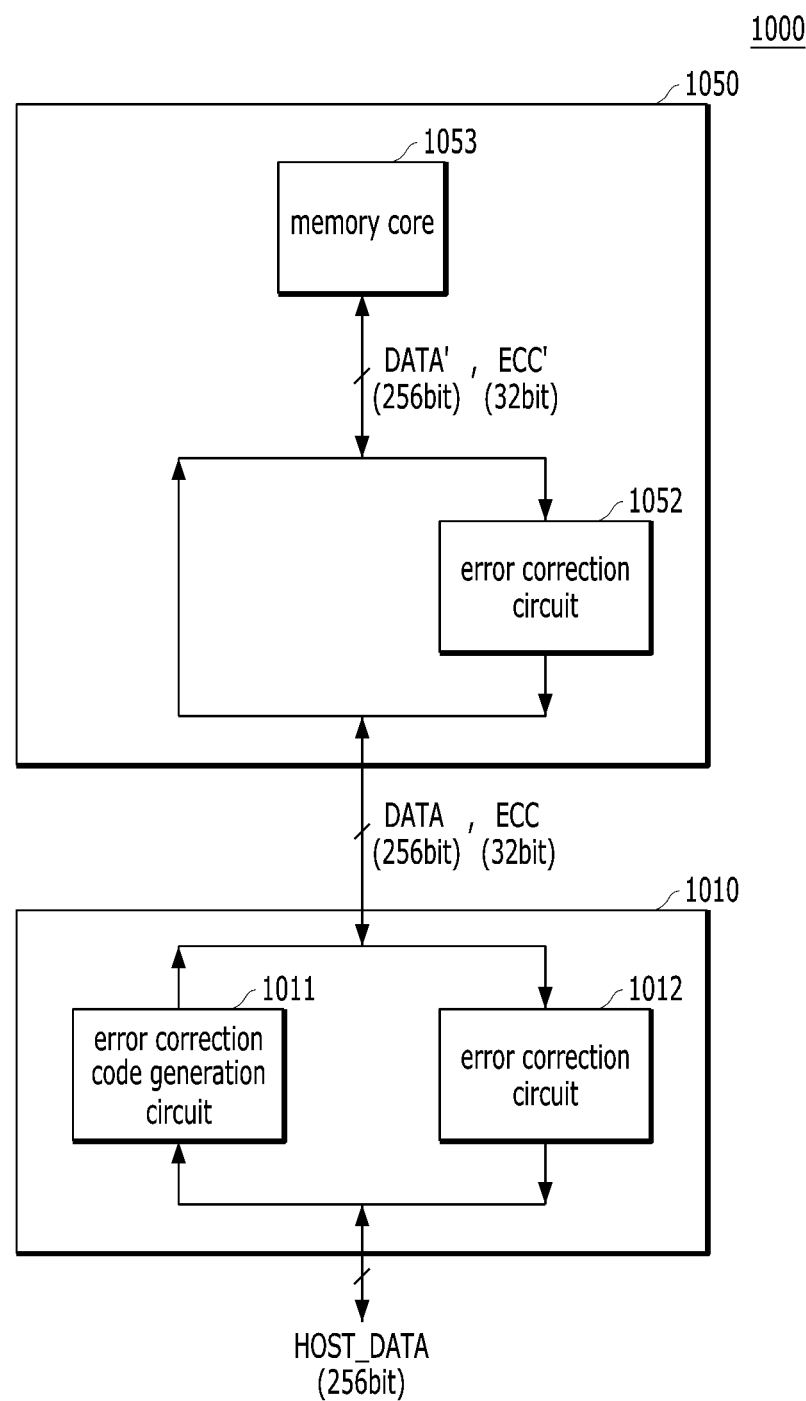
FIG. 10 is a configuration diagram illustrating a representation of an example of a memory system 1000 in accordance with still another embodiment of the present disclosure.

FIG. 10 is a configuration diagram illustrating a representation of an example of a memory system 1000 in accordance with still another embodiment of the present disclosure. FIG. 10 illustrates only components which are directly related with storage of data and error correction of data in the memory system 1000.

Referring to FIG. 10, the memory system 1000 may include a memory controller 1010 and a memory 1050.

The memory controller 1010 may control an operation of the memory 1050, such as read and write operations, according to a request of a host. The host may include a CPU (central processing unit), a GPU (graphic processing unit) or an AP (application processor). The memory controller 1010 may be included in the host or may exist outside the host. In the case where the memory controller 1010 is included in the host, host data HOST_DATA shown in the drawing may indicate data which the memory controller 1010 exchanges with the other components of the host in the host. In the case where the memory controller 1010 exists outside the host, the host data HOST_DATA shown in the drawing may indicate data which the memory controller 1010 exchanges with the host. The memory controller 1010 may include an error correction code generation circuit 1011 which generates an error correction code ECC in the write operation and an error correction circuit 1012 which performs an error correction operation by using the error correction code ECC in the read operation.

The memory 1050 may receive and store data DATA and the error correction code ECC transferred from the memory controller 1010 in the write operation, and may transfer the data DATA and the error correction code ECC, stored therein, to the memory controller 1010 in the read operation. The memory 1050 may be one of all types of memories such as a DRAM (dynamic random access memory), an HBM (high bandwidth memory), a PCRAM (phase change random access memory) and a flash memory. The memory 1050 may include a memory core 1053 for storing data DATA' and an error correction code ECC', and an error correction circuit 1052 for correcting an error of the data DATA' and the error correction code ECC' in the read operation.

The error correction code generation circuit 1011 of the memory controller 1010 may generate the error correction code ECC by using the data HOST_DATA transferred from the host, in the write operation. In the write operation, since the error correction code ECC is generated only and an operation for correcting an error is not performed, the data HOST_DATA transferred from the host and the data DATA transferred from the memory controller 1010 to the memory 1050 may be the same. The error correction code generation circuit 1011 may generate the error correction code ECC by using a Reed Solomon (RS) algorithm. That is to say, the error correction code ECC may be a Reed Solomon code (RS Code). Here, it is illustrated that the error correction code generation circuit 1011 generates the error correction code ECC of 32 bits by using the data DATA of 256 bits. Each time the read and write operations are performed once, the memory controller 1010 and the memory 1050 may transmit and receive the data DATA of 256 bits and the error correction code ECC of 32 bits.

In the write operation, the memory 1050 may store the data DATA and the error correction code ECC, transferred from the memory controller 1010, in the memory core 1053 as they are. In the write operation, since the data DATA and the error correction code ECC are stored in the memory core 1053 as they are, the data DATA and the data DATA' may be the same, and the error correction code ECC and the error correction code ECC' may be the same.

In the read operation, the data DATA' and the error correction code ECC' may be read from the memory core 1053 and be transferred to the error correction circuit 1052. The error correction circuit 1052 may correct an error of the data DATA' and the error correction code ECC' by using the error correction code ECC', and the error-corrected data DATA and error correction code ECC may be transferred from the memory 1050 to the memory controller 1010.

In the read operation, the error correction circuit 1012 of the memory controller 1010 may correct an error of the data DATA and the error correction code ECC by using the error correction code ECC transferred from the memory 1050. The error correction circuit 1012 performs the same operation as the error correction circuit 1052. By the error correction operation of the error correction circuit 1012, an error which has occurred while the data DATA and the error correction code ECC are transferred from the memory 1050 to the memory controller 1010 may be corrected. The error correction circuit 1012 may transfer the error-corrected data HOST_DATA to the host.

Although FIG. 10 illustrates that not only the error correction circuit 1012 is provided in the memory controller 1010 but also the error correction circuit 1052 is provided in the memory 1050, only one of the error correction circuits 1012 and 1052 may exist in the memory system 1000. In addition, although FIG. 10 illustrates that the memory controller 1010 includes the error correction code generation circuit 1011, the memory 1050 may include an error correction code generation circuit.

Figure 11:
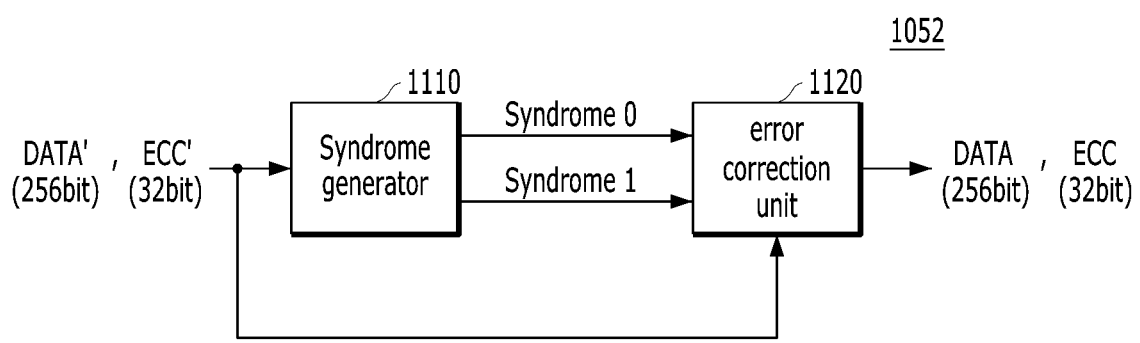
FIG. 11 is a configuration diagram illustrating a representation of an example of an embodiment of an error correction circuit 1052 of FIG. 10. An error correction circuit 1012 may also be configured as illustrated in FIG. 11.

FIG. 11 is a configuration diagram illustrating a representation of an example of an embodiment of the error correction circuit 1052 of FIG. 10. The error correction circuit 1012 may also be configured as illustrated in FIG. 11.

The error correction circuit 1052 may include a syndrome generator 1110 and an error correction unit 1120.

The syndrome generator 1110 may generate a first syndrome Syndrome 0 and a second syndrome Syndrome 1 by using the data DATA' and the error correction code ECC'. The syndrome generator 1110 may generate the first syndrome Syndrome 0 by substituting a first check matrix into the data DATA' and the error correction code ECC', and may generate the second syndrome Syndrome 1 by substituting a second check matrix into the data DATA' and the error correction code ECC'. By causing the second check matrix to include the first check matrix, the generation process of the syndromes Syndrome 0 and Syndrome 1 may be simplified, and the circuit area of the syndrome generator 1110 may be reduced, which will be described later in detail with reference to FIGS. 12 to 14. The first check matrix and the second check matrix may also be used when the error correction code generation circuit 1011 generates the error correction code ECC.

The error correction unit 1120 may find the location of an error and correct the error by using the first syndrome Syndrome 0 and the second syndrome Syndrome 1. As is well known in the art, between the first syndrome Syndrome 0 and the second syndrome Syndrome 1 which are generated by using the error correction code ECC as an RS code, the relationship of Syndrome 1/Syndrome 0=Locator(Lx) is established. Here, Locator(Lx) indicates the location of an error. Therefore, since Syndrome 1=Syndrome 0·Locator (Lx), by obtaining Syndrome 0·Locator(Lx) and comparing it with Syndrome 1, it is possible to fine a location where an error has occurred and correct the error.

Figure 12:
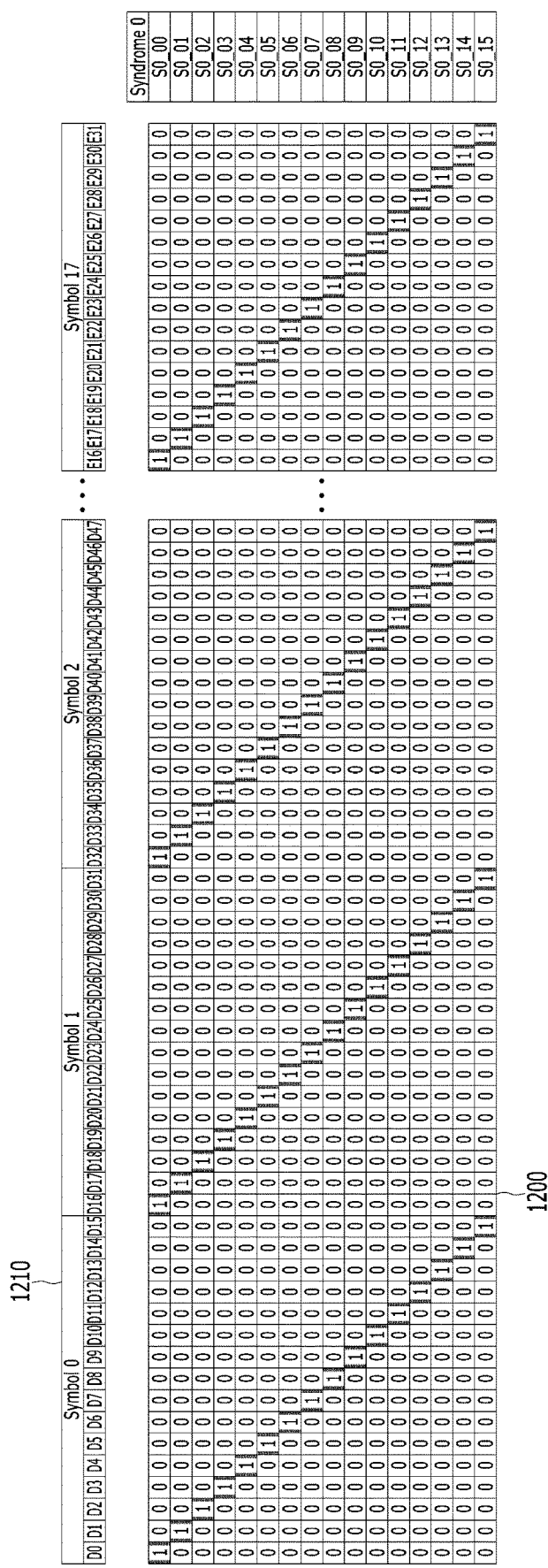
FIG. 12 is a diagram illustrating a representation of an example of a first check matrix 1200 used by a syndrome generator 1110 of FIG. 11 to generate a first syndrome Syndrome 0.

FIG. 12 is a diagram illustrating a representation of an example of a first check matrix 1200 used by the syndrome generator 1110 of FIG. 11 to generate the first syndrome Syndrome 0.

The syndrome generator 1110 may generate the 16-bit first syndrome Syndrome 0=S0_00 to S0_15 by substituting the 256-bit data DATA'=D0 to D255 and the 32-bit error correction code ECC'=E0 to E31 into the first check matrix 1200. This may be performed in the same manner as generating the result 940 by substituting the check matrix 920 into the data DATA and the error correction codes ECC_SYS_0, ECC_SYS_1 and ECC_MEM in FIG. 9.

The data D0 to D255 and the error correction code E0 to E31 are denoted by '1210' so as to indicate a correspondence relationship with the first check matrix 1200. Referring to '1210,' it may be checked that the 256-bit data D0 to D255 is divided into 16 symbols Symbol 0 to Symbol 15 and the 32-bit error correction code E0 to E31 is divided into two symbols Symbol 16 and Symbol 17. Here, each symbol may be 16 bits.

The first check matrix 1200 is a 16×288 matrix, and it may be checked that the first check matrix 1200 has a form in which 18 16×16 identity matrices are coupled.

Figure 13:
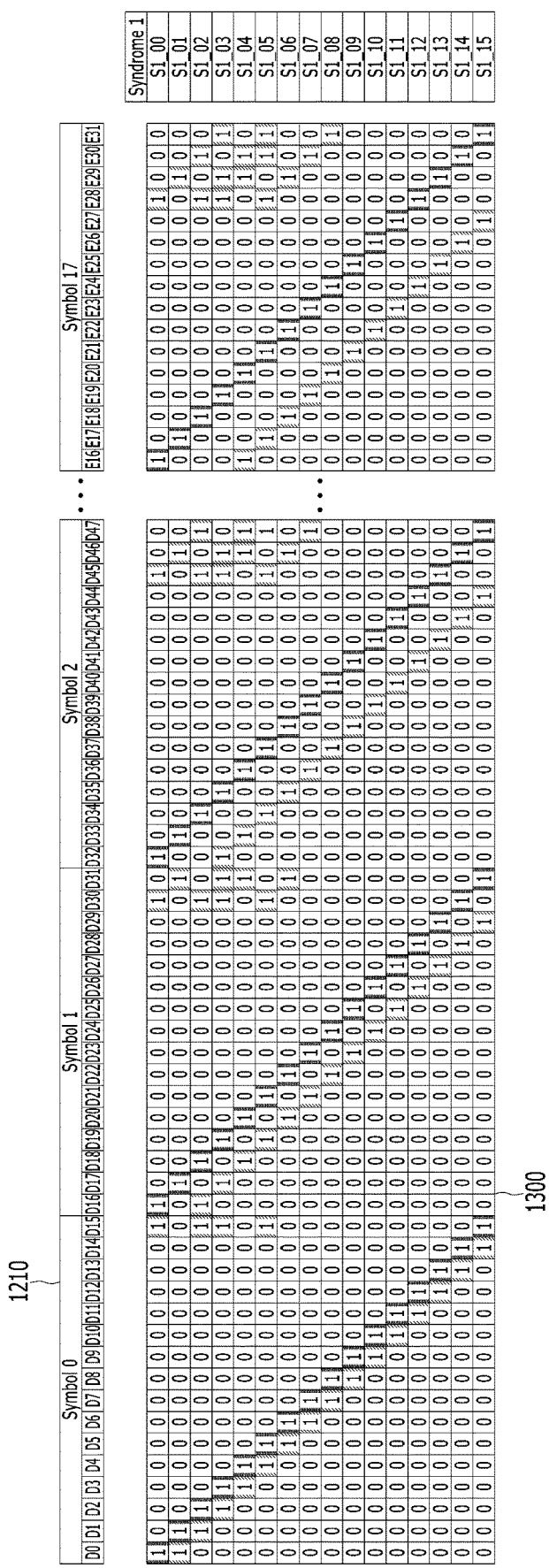
FIG. 13 is a diagram illustrating a representation of an example of a second check matrix 1300 used by the syndrome generator 1110 of FIG. 11 to generate a second syndrome Syndrome 1.

FIG. 13 is a diagram illustrating a representation of an example of a second check matrix 1300 used by the syndrome generator 1110 of FIG. 11 to generate the second syndrome Syndrome 1.

The syndrome generator 1110 may generate the 16-bit second syndrome Syndrome 1=S1_00 to S1_15 by substituting the 256-bit data DATA'=D0 to D255 and the 32-bit error correction code ECC'=E0 to E31 into the second check matrix 1300. The first check matrix 1200 and the second check matrix 1300 may also be used in the process of generating the error correction code E0 to E31. In other words, the error correction code generation circuit 1011 may use the first check matrix 1200 and the second check matrix 1300.

By observing the second check matrix 1300, it may be checked that the second check matrix 1300 includes the first check matrix 1200 as it is. Namely, it may be checked that constituents having values of '1' in the first check matrix 1200 have values of '1' in the second check matrix 1300 as well. There may be several tens of thousands of matrix candidates that can be used as the second check matrix 1300. By selecting and using, among the matrix candidates, the second check matrix 1300 including the first check matrix 1200 as it is, advantages may be provided. In particular, calculation required to generate the second syndrome Syndrome 1 may be simplified, and as a result, the circuit area of the syndrome generator 1110 may be reduced.

Figure 14:
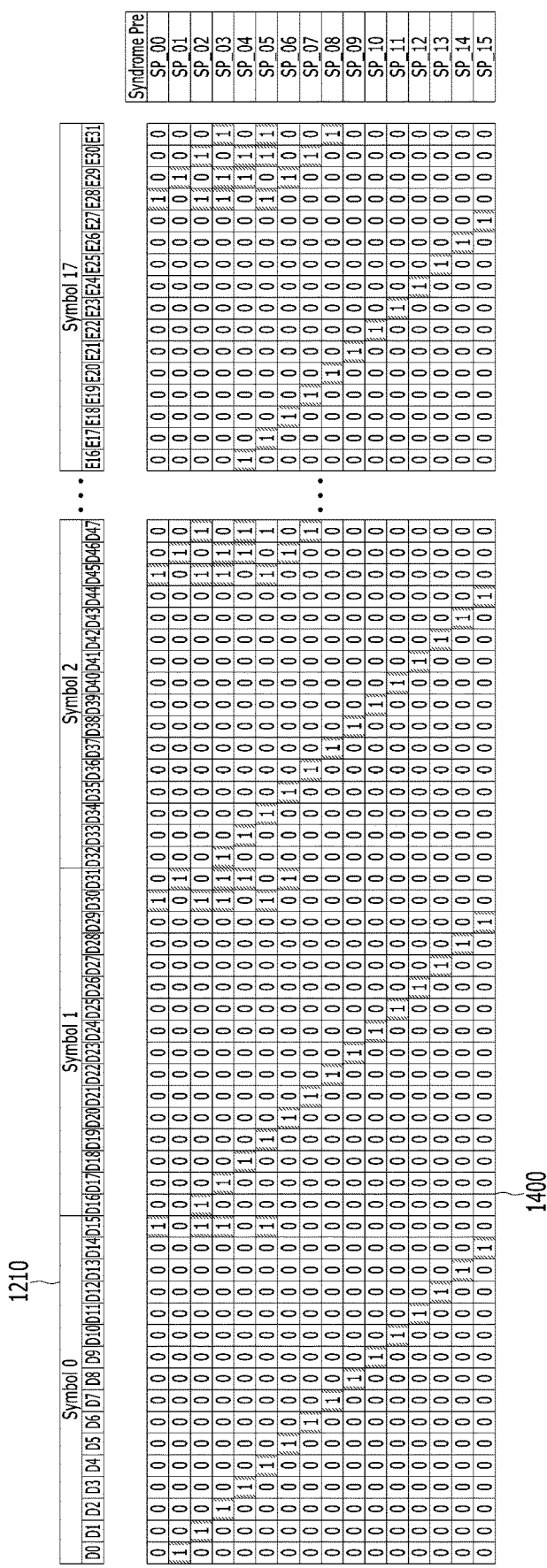
FIG. 14 is a diagram illustrating a representation of an example of a check matrix 1400 obtained by subtracting the first check matrix 1200 from the second check matrix 1300.

FIG. 14 is a diagram illustrating a representation of an example of a check matrix 1400 obtained by subtracting the first check matrix 1200 from the second check matrix 1300. The syndrome generator 1110 may generate a 16-bit pre-syndrome Syndrome Pre=SP_00 to SP_15 by substituting the 256-bit data DATA'=D0 to D255 and the 32-bit error correction code ECC'=E0 to E31 into the check matrix 1400. The second syndrome Syndrome 1 may be generated by adding the first syndrome Syndrome 0 to the pre-syndrome Syndrome Pre. In the case of performing calculation by substituting the data D0 to D255 and the error correction code E0 to E31 into the check matrix 1400, the greater the number of values of '1' in the check matrix 1400 is, the more calculation is required. Since the check matrix 1400 has values of '1' 40% less than the second check matrix 1300, the syndrome generator 1110 may reduce required calculation by 40% by performing calculation by using the check matrix 1400 instead of the second check matrix 1300. This may mean that the number of elements (e.g., XOR gates) required to generate the second syndrome Syndrome 1 in the syndrome generator 1110 is reduced by 40%.

In summary, in order for the syndrome generator 1110 to generate the second syndrome Syndrome 1, calculation should be performed by substituting the second check matrix 1300 into the data D0 to D255 and the error correction code E0 to E31. In the case where the second check matrix 1300 includes the first check matrix 1200, the syndrome generator 1110 may simplify the calculation of substituting the second check matrix 1300 into the data D0 to D255 and the error correction code E0 to E31. The syndrome generator 1110 may generate the pre-syndrome Syndrome Pre by performing calculation by substituting [the second check matrix 1300]–[the first check matrix 1200], that is, the check matrix 1400, into the data D0 to D255 and the error correction code E0 to E31, and may generate the second syndrome Syndrome 1 by adding the already generated first syndrome Syndrome 0 to the pre-syndrome Syndrome Pre.

Although various embodiments have been described for illustrative purposes, it will be apparent to those skilled in the art that various changes and modifications may be made without departing from the spirit and scope of the invention as defined in the following claims.

In particular, the numbers of bits of the data and the error correction codes exemplified in the above embodiments may be different from those of the above examples.

What is claimed is:

1. A memory comprising:
   a memory core configured to store data and an error correction code corresponding to the data;
   a syndrome generator configured to generate a first syndrome by substituting the data and the error correction code, read from the memory core, into a first check matrix, and generate a second syndrome by substituting the data and the error correction code, read from the memory core, into a second check matrix; and
   an error correction unit configured to correct an error of the read data and error correction code by using the first syndrome and the second syndrome,
   wherein constituents having values of '1' in the first check matrix have values of '1' also in the second check matrix.

2. The memory according to claim 1, wherein the syndrome generator
   generates the first syndrome by substituting the first check matrix into the data and the error correction code read from the memory core, and
   generates a pre-syndrome by substituting the data and the error correction code, read from the memory core, into [the second check matrix]–[the first check matrix], and generates the second syndrome by adding the pre-syndrome and the first syndrome.

3. The memory according to claim 1, wherein the error correction code is a Reed-Solomon type code.

4. The memory according to claim 3, wherein the error correction code is a code generated in a memory controller which controls the memory.

5. The memory according to claim 3, further comprising:
   an error correction code generation circuit configured to generate the error correction code to be stored in the memory core, in a write operation.

6. The memory according to claim 3, wherein the data is 256 bits (16 symbols and one symbol is 16 bits), and the error correction code is 32 bits (two symbols).

7. The memory according to claim 6,
   wherein each of the first check matrix and the second check matrix is a 16×288 matrix, and
   wherein the first check matrix includes 18 16×16 identity matrices.

8. A method for operating a memory, comprising:
   reading data and an error correction code corresponding to the data from a memory core;
   generating a first syndrome by substituting the data and the error correction code, read from the memory core, into a first check matrix;
   generating a pre-syndrome by substituting the data and the error correction code, read from the memory core, into [a second check matrix]–[the first check matrix];
   generating the second syndrome by adding the pre-syndrome and the first syndrome; and
   correcting an error of the read data and error correction code by using the first syndrome and the second syndrome.

9. The method according to claim 8, wherein constituents having values of '1' in the first check matrix have values of '1' also in the second check matrix.

10. The method according to claim 9, wherein the error correction code is a Reed-Solomon type code.

11. The method according to claim 9, wherein the data is 256 bits (16 symbols and one symbol is 16 bits), and the error correction code is 32 bits (two symbols).

12. The method according to claim 11,
wherein each of the first check matrix and the second check matrix is a 16×288 matrix, and
wherein the first check matrix includes 18 16×16 identity matrices.

13. A memory system comprising:
a memory configured to output data and an error correction code corresponding to the data in a read operation; and
a memory controller configured to control the memory, and receive the data and the error correction code from the memory in the read operation,
wherein the memory controller comprises:
a syndrome generator configured to generate a first syndrome by substituting the data and the error correction code into a first check matrix, and generate a second syndrome by substituting the data and the error correction code into a second check matrix; and
an error correction unit configured to correct an error of the data by using the first syndrome and the second syndrome, and
wherein constituents having values of '1' in the first check matrix have values of '1' also in the second check matrix.

14. The memory system according to claim 13, wherein the syndrome generator
generates the first syndrome by substituting the data and the error correction code into the first check matrix into, and
generates a pre-syndrome by substituting the data and the error correction code into [the second check matrix]–[the first check matrix], and generates the second syndrome by adding the pre-syndrome and the first syndrome.

15. The memory system according to claim 13, wherein the error correction code is a Reed-Solomon type code.

16. The memory system according to claim 15, wherein the data is 256 bits (16 symbols and one symbol is 16 bits), and the error correction code is 32 bits (two symbols).

17. The memory system according to claim 16,
wherein each of the first check matrix and the second check matrix is a 16×288 matrix, and
wherein the first check matrix includes 18 16×16 identity matrices.

18. The memory system according to claim 13, wherein the memory controller further comprises:
an error correction code generation circuit configured to generate an error correction code corresponding to write data, by using the write data in a write operation.

* * * * *